US012787436B2

(12) United States Patent
Park et al.

(10) Patent No.: US 12,787,436 B2
(45) Date of Patent: Nov. 3, 2026

(54) DISPLAY DEVICE AND TILING DISPLAY DEVICE

(71) Applicant: LG DISPLAY CO., LTD., Seoul (KR)

(72) Inventors: Jun Park, Paju-si (KR); SuHo Ha, Paju-si (KR); Laebong Jang, Incheon (KR)

(73) Assignee: LG DISPLAY CO., LTD., Seoul (KR)

( * ) Notice: Subject to any disclaimer, the term of this patent is extended or adjusted under 35 U.S.C. 154(b) by 562 days.

(21) Appl. No.: 18/221,046

(22) Filed: Jul. 12, 2023

(65) Prior Publication Data

US 2024/0021625 A1 Jan. 18, 2024

(30) Foreign Application Priority Data

Jul. 13, 2022 (KR) ........................ 10-2022-0086251

(51) Int. Cl.

| | |
|---|---|
| ***H05K 9/00*** | (2006.01) |
| ***H10D 86/40*** | (2025.01) |
| ***H10D 86/60*** | (2025.01) |
| ***H10W 90/00*** | (2026.01) |
| *H10W 72/00* | (2026.01) |
| *H10W 90/22* | (2026.01) |

(52) U.S. Cl.

CPC ........... *H10D 86/60* (2025.01); *H05K 9/0064* (2013.01); *H10D 86/441* (2025.01); *H10W 90/00* (2026.01); *H10W 72/874* (2026.01); *H10W 90/22* (2026.01); *H10W 90/732* (2026.01)

(58) Field of Classification Search

CPC .... H05K 9/0064; H10D 86/441; H10D 86/60; H10W 72/874; H10W 90/00; H10W 90/22; H10W 90/732

USPC .......................................................... 361/729

See application file for complete search history.

(56) References Cited

U.S. PATENT DOCUMENTS

| | | | | |
|---|---|---|---|---|
| 2011/0128208 | A1 | 6/2011 | Choi | |
| 2011/0260949 | A1 | 10/2011 | Ahn et al. | |
| 2018/0062249 | A1 | 3/2018 | Sung et al. | |
| 2021/0158776 | A1 | 5/2021 | Zhou et al. | |
| 2021/0202907 | A1* | 7/2021 | Lee ...................... | G09G 3/3208 |

FOREIGN PATENT DOCUMENTS

| | | | |
|---|---|---|---|
| CN | 102081884 | A | 6/2011 |
| CN | 102237014 | A | 11/2011 |
| CN | 109690867 | A | 4/2019 |
| CN | 110865488 | A | 3/2020 |

(Continued)

OTHER PUBLICATIONS

Office Action dated Dec. 19, 2025, issued in Korean Patent Application No. 10-2022-0086251.

*Primary Examiner* — Timothy J Thompson
*Assistant Examiner* — Guillermo J Egoavil
(74) *Attorney, Agent, or Firm* — PnK IP LLC

(57) ABSTRACT

A display device includes a display panel; a plurality of contact units disposed on side surfaces of the display panel; a metal cover disposed on a rear surface of the display panel and grounded; and a connection line disposed between the metal cover and the plurality of contact units. Accordingly, in the present disclosure, by disposing the plurality of contact units connected to the metal cover on the side surfaces of the display panel, the metal covers of the display devices may be connected to each other when implementing a tiling display device.

18 Claims, 14 Drawing Sheets

(56) References Cited

FOREIGN PATENT DOCUMENTS

| | | | |
|---|---|---|---|
| CN | 113130599 | A | 7/2021 |
| JP | 2008-152063 | A | 7/2008 |
| KR | 10-2005-0068460 | A | 7/2005 |
| KR | 10-2010-0021217 | A | 2/2010 |
| KR | 10-2021-0017498 | A | 2/2021 |
| KR | 10-2022-0085608 | | 6/2022 |
| KR | 10-2022-0091278 | | 6/2022 |
| KR | 10-2022-0096888 | | 7/2022 |
| WO | 2022/139393 | A1 | 6/2022 |

* cited by examiner

DISPLAY DEVICE AND TILING DISPLAY DEVICE

CROSS-REFERENCE TO RELATED APPLICATION

This application claims the priority of Korean Patent Application No. 10-2022-0086251 filed on Jul. 13, 2022, which is hereby incorporated by reference in its entirety.

BACKGROUND

Field of the Disclosure

The present disclosure relates to a display device and a tiling display device, and more particularly, to a display device and a tiling display device capable of controlling signal noise by selectively connecting ground structures of a plurality of respective display devices.

Description of the Background

Display devices used in computer monitors, TVs, and mobile phones include organic light emitting displays (OLEDs) that emit light by themselves, and liquid crystal displays (LCDs) that require a separate light source.

Display devices are being applied to more and more various fields of application including not only computer monitors and TVs, but also personal mobile devices, and thus, display devices having a reduced volume and weight while having a wide display area are being studied.

The display devices may include lines for transmitting various signals, and magnetic fields may be generated inside and outside the display device by signals applied to the lines. Due to the magnetic fields, electro-magnetic interference (EMI) may be generated, and as a result, noise may be generated in various signals for driving the display device. In particular, in the case of a tiling display device in which a plurality of display devices are connected and used, a plurality of signal lines exist, and as they are used simultaneously, they may be more vulnerable to noise.

SUMMARY

Accordingly, an aspect of the present disclosure is to provide a display device and a tiling display device capable of reducing signal noise by varying a shape of an antenna radiating EMI noise.

Another aspect of the present disclosure is to provide display devices and a tiling display device in which reliability degradation due to signal noise is minimized by stably grounding a plurality of display devices.

Still another aspect of the present disclosure is to provide display devices and a tiling display device capable of reducing noise by minimizing a ground potential difference between a plurality of respective display devices.

Still another aspect of the present disclosure is to provide display devices and a tiling display device capable of reducing noise by connecting ground structures of a plurality of display devices to each other.

The present disclosure is not limited to the above-mentioned features, which are not mentioned above, may be clearly understood by those skilled in the art from the following descriptions.

A display device according to an exemplary aspect of the present disclosure includes a display panel; a plurality of contact units disposed on side surfaces of the display panel;

a metal cover disposed on a rear surface of the display panel and grounded; and a connection line disposed between the metal cover and the plurality of contact units. Accordingly, in the present disclosure, by disposing the plurality of contact units connected to the metal cover on the side surfaces of the display panel, the metal covers of the display devices may be connected to each other when implementing a tiling display device.

A tiling display device according to another exemplary aspect of the present disclosure includes a plurality of display devices arranged in a tile form; and a plurality of contact units disposed on side surfaces of each of the plurality of display devices, wherein each of the plurality of display devices includes a display panel having the plurality of contact units disposed on the side surfaces thereof; and a metal cover disposed on a rear surface of the display panel, wherein the metal covers of the plurality of display devices are connected to each other selectively through the plurality of contact units. Therefore, according to the present disclosure, a signal noise reduction design for each frequency may be implemented variously by selectively connecting the metal cover of one display device to the metal cover of another display device.

Other detailed matters of the exemplary aspects are included in the detailed description and the drawings.

According to the present disclosure, signal noise may be reduced by stably connecting ground structures of a plurality of respective display devices.

According to the present disclosure, signal noise may be reduced by selectively connecting ground structures of a plurality of respective display devices to vary a shape of an antenna.

According to the present disclosure, connection structures of ground structures of a plurality of display devices may be varied in consideration of characteristics of signal noise.

The effects according to the present disclosure are not limited to the contents exemplified above, and more various effects are included in the present specification.

BRIEF DESCRIPTION OF THE DRAWINGS

The accompanying drawings, which are included to provide a further understanding of the disclosure and are incorporated in and constitute a part of the disclosure, illustrate aspects of the disclosure and together with the description serve to explain the principle of the disclosure.

In the drawings.

DETAILED DESCRIPTION

Figure 1:
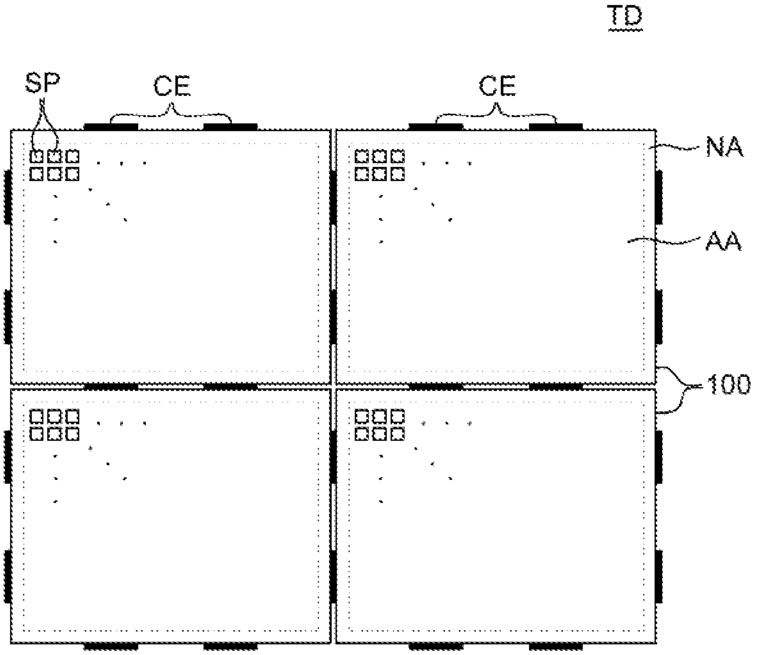
FIG. 1 is a plan view of display devices and a tiling display device according to an exemplary aspect of the present disclosure.

Advantages and characteristics of the present disclosure and a method of achieving the advantages and characteristics will be clear by referring to exemplary aspects described below in detail together with the accompanying drawings. However, the present disclosure is not limited to the exemplary aspects disclosed herein but will be implemented in various forms. The exemplary aspects are provided by way of example only so that those skilled in the art may fully understand the disclosures of the present disclosure and the scope of the present disclosure.

The shapes, sizes, ratios, angles, numbers, and the like illustrated in the accompanying drawings for describing the exemplary aspects of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is disposed "on" another element or layer, another layer or another element may be interposed directly on the other element or layer or therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various aspects of the present disclosure may be partially or entirely adhered to or combined with each other and may be interlocked and operated in technically various ways, and the aspects may be carried out independently of or in association with each other.

Hereinafter, a display device and a tiling display device according to exemplary aspects of the present disclosure will be described in detail with reference to accompanying drawings.

Figure 2:
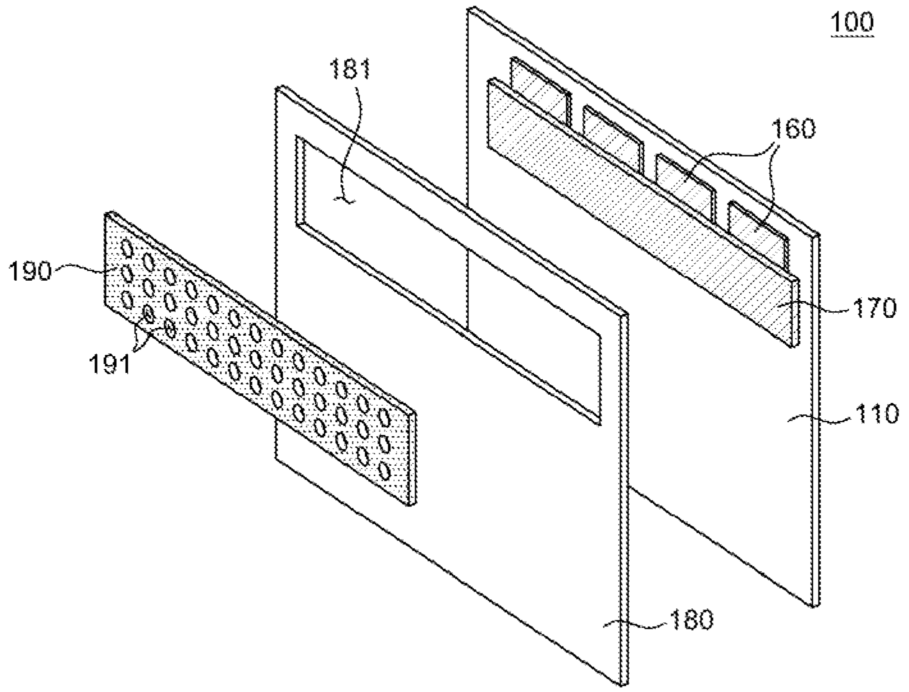
FIG. 2 is an exploded perspective view of the display device according to an exemplary aspect of the present disclosure.
Figure 3:
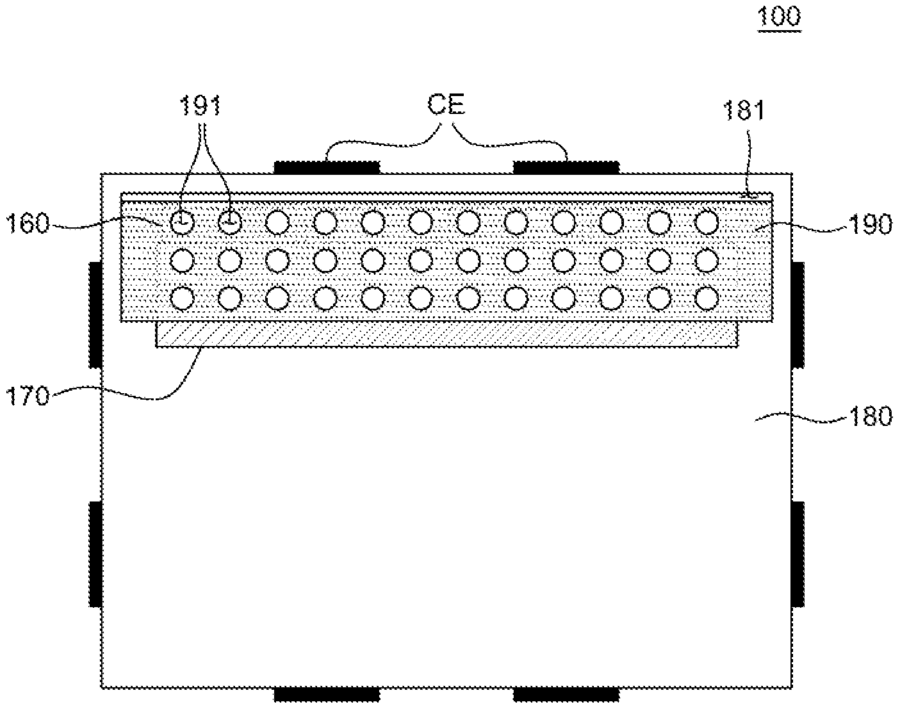
FIGS. 3 and 4 are rear views of the display device according to an exemplary aspect of the present disclosure.
Figure 4:
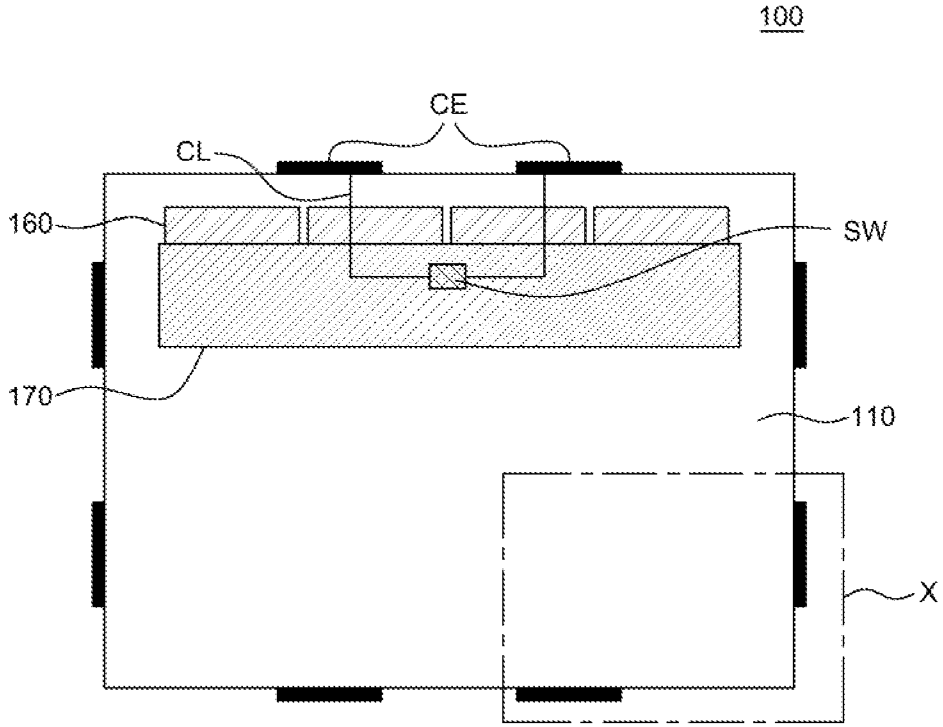
Figure 5:
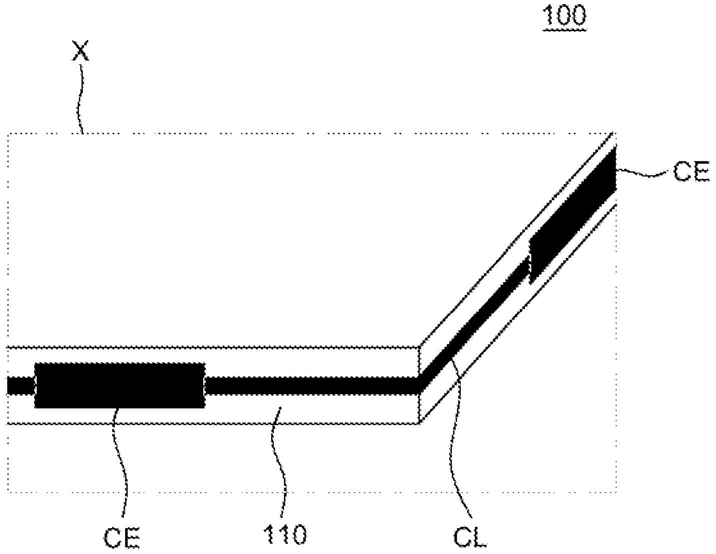
FIG. 5 is a schematic enlarged perspective view of the display device for area X of FIG. 4.
Figure 6:
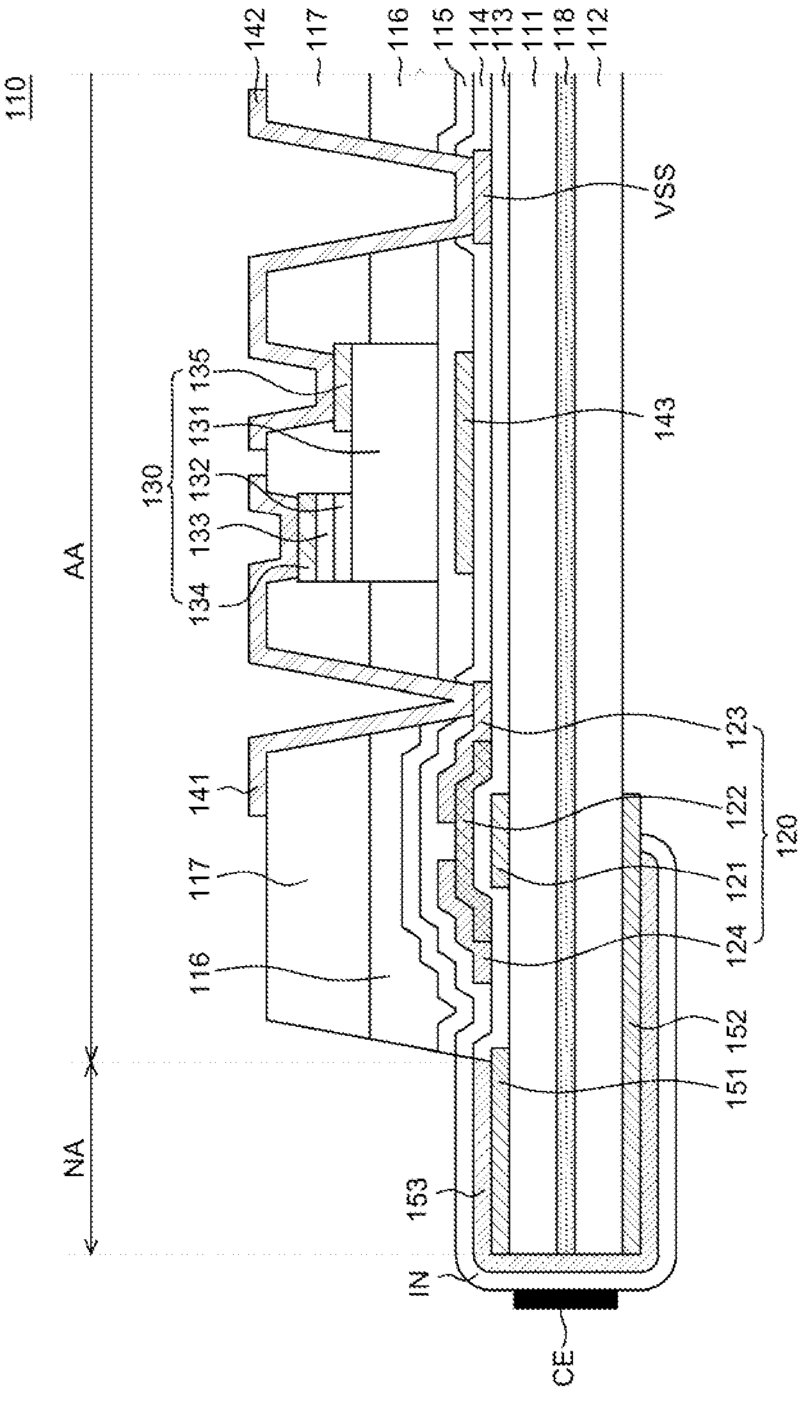
FIG. 6 is a cross-sectional view of a sub-pixel of the display device according to an exemplary aspect of the present disclosure.

FIG. 1 is a plan view of display devices and a tiling display device according to an exemplary aspect of the present disclosure. FIG. 2 is an exploded perspective view of the display device according to an exemplary aspect of the present disclosure. FIGS. 3 and 4 are rear views of the display device according to an exemplary aspect of the present disclosure. FIG. 5 is a schematic enlarged perspective view of the display device for area X of FIG. 4. FIG. 6 is a cross-sectional view of a sub-pixel of the display device according to an exemplary aspect of the present disclosure. Specifically, FIG. 2 is an exploded perspective view of the display device viewed from a rear side. For convenience of description, illustrations of a plurality of contact units CE and a connection line CL are omitted in FIG. 2, and illustrations of a first metal cover 180 and a second metal cover 190 are omitted in FIG. 4.

Referring to FIG. 1, a tiling display device TD according to an exemplary aspect of the present disclosure may be formed by connecting a plurality of display devices 100 according to an exemplary aspect of the present disclosure. The tiling display device TD is implemented by the plurality of display devices 100 connected to each other and may allow for enlargement of a display area on which an image is displayed.

Each of the plurality of display devices 100 constituting the tiling display device TD is arranged like one display device 100. For example, the tiling display device TD may be implemented by attaching the plurality of display devices 100 in a tile form to a frame or a wall portion. In this case, the plurality of display devices 100 may be connected with various lines and cables and driven as one display device 100. Also, the plurality of display devices 100 may be connected in a lineless communication method without a separate line or cable.

Also, when attaching the plurality of display devices 100, the plurality of display devices 100 may be attached to each other as closely as possible so that distances between the plurality of display devices 100 are constant and minimized as if the plurality of display devices 100 appear to be one display device 100. That is, by precisely aligning and attaching the plurality of display devices 100 to the wall portion, a boundary area where no image is displayed may be minimized.

Referring to FIGS. 2 to 4, each of the plurality of display devices 100 includes a display panel 110, a plurality of flexible films 160, a printed circuit board 170, the first metal cover 180, the second metal cover 190, the plurality of contact units CE, the connection line CL, and a switching unit SW.

In the display panel 110, for example, light emitting elements 130 and circuits, lines, and components for driving the light emitting elements 130 may be disposed. The light emitting elements 130 may be defined differently depending on a type of the display panel 110. For example, when the display panel 110 is an organic light emitting display panel, the light emitting element 130 may be an organic light emitting element including an anode, an organic light emitting layer, and a cathode. For example, when the display panel 110 is an inorganic light emitting display panel, the light emitting element 130 may be a light emitting diode (LED) or a micro-LED including an n-type semiconductor layer, a p-type semiconductor layer, and a light emitting layer. However, the present disclosure is not limited thereto, and the light emitting element 130 of the display panel 110 may be configured variously.

The display panel 110 includes an active area AA and a non-active area NA.

The active area AA is an area where an image is displayed on the display panel 110. A plurality of sub-pixels SP constituting a plurality of pixels and a circuit for driving the plurality of sub-pixels SP may be disposed in the active area AA. The plurality of sub-pixels SP are minimum units constituting the active area AA, and the light emitting element 130 may be disposed in each of the plurality of sub-pixels SP. Also, the circuit for driving the plurality of sub-pixels SP may include driving elements and lines. For example, the circuit may include a plurality of transistors, storage capacitors, scan lines, data lines, and the like, but the present disclosure is not limited thereto. A more detailed description of the plurality of sub-pixels SP will be described later with reference to FIG. 6.

The non-active area NA is an area where an image is not displayed and may be defined as an area surrounding the active area AA. In the non-active area NA, link lines 152 for transmitting signals to the light emitting elements 130 and the circuit disposed in the active area AA, or driver ICs such as gate driver ICs or data driver ICs may be disposed. However, the present disclosure is not limited thereto.

Meanwhile, in the present disclosure, it is described that the active area AA and the non-active area NA are defined on a front surface of the display panel 110, but the non-active area NA may be defined as not being present, and the present disclosure is not limited thereto. That is, when a tiling display device TD is implemented using the display devices 100 according to an exemplary aspect of the present disclosure, a distance between an outermost sub-pixel SP of one display device 100 and an outermost sub-pixel SP of another display device 100 adjacent thereto may be implemented to be equal to a distance between the plurality of sub-pixels SP in one display device 100. Accordingly, it is possible to implement a zero bezel in which a bezel area does not substantially exist. Thus, only the active area AA where an image is displayed may be defined on the front surface of the display panel 110, but the present disclosure is not limited thereto.

The plurality of flexible films 160 are bonded onto a rear surface of the display panel 110. The plurality of flexible films 160 are films that supply signals to the plurality of sub-pixels SP by disposing various components on a flexible base film, and may be electrically connected to the display panel 110. The plurality of flexible films 160 may supply power voltages and data voltages to the display panel 110. Meanwhile, although it is illustrated that the plurality of flexible films 160 are four flexible films 160 that are bonded adjacent to an upper edge of the display panel 110 in the drawings, the number and arrangements of the plurality of flexible films 160 may be variously changed according to design, and the present disclosure is not limited thereto.

Meanwhile, driver ICs such as gate driver ICs and data driver ICs may be disposed on the plurality of flexible films 160. The driver IC is a component that processes data for displaying an image and a driving signal for processing the data. The driver IC may be disposed in a method such as a chip on glass (COG) method, a chip on film (COF) method, or a tape carrier package (TCP) method depending on a mounting method. However, for convenience of description, it is described that the driver IC is mounted on the plurality of flexible films 160 in the chip on film method, but the present disclosure is not limited thereto.

The printed circuit board 170 is disposed on the rear surface of the display panel 110. The printed circuit board 170 and the plurality of flexible films 160 are electrically connected to each other. The printed circuit board 170 is a component that supplies signals to the driver IC. The printed circuit board 170 may have various components disposed therein for supplying various signals such as driving signals and data signals to the driver IC. Meanwhile, although one printed circuit board 170 is illustrated in the drawings, the number of printed circuit boards 170 may be variously changed according to design, and the present disclosure is not limited thereto.

A metal cover including the first metal cover 180 and the second metal cover 190 is disposed on the rear surface of the display panel 110. The metal cover may be disposed to cover the rear surface of the display panel 110 to protect the display panel 110 from the outside. In addition, the metal cover may function as a panel ground having a ground plane and be used to control signal noise.

The first metal cover 180 is disposed on the rear surface of the display panel 110. The first metal cover 180 may be disposed between the display panel 110 and the plurality of flexible films 160 and between the display panel 110 and the printed circuit board 170, on the rear surface of the display panel 110. The first metal cover 180 may support the display panel 110 on the rear surface of the display panel 110 and function as a ground structure. That is, the first metal cover 180 may function as a ground terminal to form a ground plane of the display device 100 and contribute to reducing obstruction received from electromagnetic interference (EMI) to an appropriate level or less. The first metal cover 180 may be formed of a material having rigidity, and may be formed of a metal material, for example, aluminum (Al), copper (Cu), zinc (Zn), silver (Ag), gold (Au), iron (Fe), steel use stainless (SUS) or Invar.

The first metal cover 180 includes an opening 181 corresponding to the plurality of flexible films 160 and the printed circuit board 170. The plurality of flexible films 160 and the printed circuit board 170 may be disposed on the display panel 110 through the opening 181 of the first metal cover 180. That is, the plurality of flexible films 160 and the printed circuit board 170 may contact a rear surface of the display panel 110 through the opening 181. Meanwhile, although the opening 181 is illustrated as having a size corresponding to sizes of the plurality of flexible films 160 and the printed circuit board 170 in the drawings, the opening 181 may be designed in various sizes and the present disclosure is not limited thereto.

The second metal cover 190 covering the plurality of flexible films 160 and the printed circuit board 170 is disposed. The second metal cover 190 may be coupled to the rear surface of the first metal cover 180 and cover at least portions of the plurality of flexible films 160 and the printed circuit board 170 exposed from the first metal cover 180. The second metal cover 190 may protect the plurality of flexible films 160 and the printed circuit board 170 from external impacts. In addition, the second metal cover 190 may also function as a ground structure to form a ground plane, and may reduce signal noise caused by electromagnetic interference. For example, the second metal cover 190 may be formed of a material having rigidity, and may be formed of a metal material, for example, aluminum (Al), copper (Cu), zinc (Zn), silver (Ag), gold (Au), iron (Fe), steel use stainless (SUS) or Invar.

The second metal cover 190 includes a plurality of holes 191. The plurality of holes 191 are holes 191 for dissipating heat generated from the display device 100 when the display device 100 is driven. The plurality of holes 191 are disposed to overlap with the plurality of flexible films 160 and the printed circuit board 170, which generate a lot of heat, so that heat generated in the display device 100 may be effectively dissipated. Meanwhile, in the drawings, it is illustrated that the plurality of holes 191 are formed in a front surface of the second metal cover 190, but shapes and arrangements of the plurality of holes 191 are exemplary and are not limited thereto.

Meanwhile, the first metal cover 180 and the second metal cover 190 may be panel grounds functioning as ground structures as described above. That is, the first metal cover 180 and the second metal cover 190 formed of a metal material may be in a grounded state and form a ground plane in the display device 100. Accordingly, some components of the display device 100 may be connected to the first metal cover 180 and the second metal cover 190 functioning as ground structures and may be grounded. For example, the printed circuit board 170 may be grounded by being connected to the first metal cover 180 and the second metal cover 190 through separate pads.

Meanwhile, various signals flow through each of the plurality of display devices constituting the tiling display device, and electromagnetic interference and consequent signal noise may occur due to magnetic fields generated from these signals. The signal noise due to electromagnetic interference may include noise generated when an output of a channel is made, noise formed along a path through which a signal passes, and radiation noise radiated through a conductor of a display device. In particular, the radiation noise is radiated using conductors of a display device, for example, the first metal cover and the second metal cover, which are metal plates, as antennas, and may act as harmful electromagnetic waves that adversely affect the display device and other adjacent display devices.

Accordingly, in the display devices 100 and the tiling display device TD according to an exemplary aspect of the present disclosure, the first metal cover 180 and the second metal cover 190 are electrically connected to the first metal cover 180 and the second metal cover 190 of another display device 100 adjacent thereto to vary shapes of antennas, so that signal noise, in particular, radiation noise, may be controlled. In this case, in the tiling display device TD in which the plurality of display devices 100 are tiled, noise radiated by using each of the display devices 100 as antennas may be reduced or amplified according to an overall shape of ground planes according to connection structures of the first metal covers 180 and the second metal covers 190. For example, frequencies of signal noise that may be effectively controlled may be different in a case where the first metal covers 180 and the second metal covers 190 of the plurality of respective display devices 100 are separated from each other and have individual ground planes, and in a case where the first metal covers 180 and the second metal covers 190 of the plurality of respective display devices 100 are connected to each other to form one ground plane. Therefore, when the connection structure of the first metal cover 180 and the second metal cover 190 is fixed, it is possible to cope with only signal noise of some frequencies. Therefore, in the display devices 100 and the tiling display device TD according to an exemplary aspect of the present disclosure, signal noise of various frequencies may be reduced by varying the connection structures of the first metal covers 180 and the second metal covers 190 of the plurality of respective display devices 100 by using the switching units SW.

Conventionally, the first metal cover and the second metal cover are ground structures having a ground plane and may function as panel grounds. Ground planes of a plurality of respective display devices constituting a tiling display device are not connected to each other and exist individually. However, since a ground structure of each of the plurality of display devices is one type of power source, a potential difference may exist therebetween, and the potential difference adversely affects signal noise. In addition, when impedances of the first metal cover and the second metal cover, which are ground structures, are high, the first metal cover and the second metal cover may aggravate noise.

Therefore, in the display devices 100 and the tiling display device TD according to an exemplary aspect of the present disclosure, the plurality of contact units CE are formed on side surfaces of each of the plurality of display devices 100, so that the first metal cover 180 and the second metal cover 190, which are ground structures of each of the plurality of display devices 100 may be connected to ground structures of another display device 100. That is, panel grounds of the plurality of respective display devices 100 may be connected to each other by connecting the first metal covers 180 and the second metal covers 190 of the plurality of display devices 100. Accordingly, since the ground structures of the plurality of respective display devices 100 are connected to each other to minimize a potential difference and impedance, one of causes of signal noise may be removed.

Specifically, referring to FIGS. 1 and 4 to 6, the plurality of contact units CE are disposed on the side surfaces of each of the plurality of display devices 100. For example, the plurality of contact units CE are disposed on side surfaces of the display panel 110. When the tiling display device TD is formed by tiling the plurality of display devices 100, the plurality of contact units CE are electrodes that electrically connect the first metal covers 180 and the second metal covers 190 of the display devices 100 adjacent to each other. The plurality of contact units CE disposed on the side surfaces of each of the plurality of display devices 100 may be formed to correspond to the contact units CE of another display devices 100 adjacent thereto, and may come into contact therewith when the tiling display device TD is formed. For example, referring to FIG. 1, the contact units CE of the display device 100 at an upper left may come into contact with the contact units CE of the display device 100 disposed at an upper right and the contact units CE of the display device 100 disposed at a lower left among the plurality of display devices 100. Meanwhile, although it is illustrated that two contact units CE are disposed on each of four sides of the display device 100 in the drawings, the number, sizes, and arrangements of the plurality of contact units CE may be implemented variously according to design, and the present disclosure is not limited thereto.

Referring to FIG. 5, the connection line CL is disposed along the side surfaces of the display panel 110. The connection line CL extends along the side surfaces of the display panel 110 and may be connected to the plurality of contact units CE formed in one display device 100. The connection line CL may be disposed to surround all the side surfaces of the display panel 110 and be connected to all of the plurality of contact units CE. Also, as illustrated in FIG. 4, a portion of the connection line CL may extend toward the flexible films 160 and the printed circuit board 170 on the rear surface of the display panel 110 and be connected to the switching unit SW.

Referring to FIG. 4, the switching unit SW is disposed on one of the plurality of flexible films 160 and the printed circuit board 170. The switching unit SW is a component that selectively connects the connection line CL and the plurality of contact units CE to the first metal cover 180 and the second metal cover 190. The plurality of contact units CE may be grounded by being connected to the first metal cover 180 and the second metal cover 190 functioning as ground structures through the switching unit SW, or may be separated from the first metal cover 180 and the second metal cover 190 and be floating. In this case, separate pads may be formed on the printed circuit board 170 to connect the switching unit SW and the first metal cover 180 and the second metal cover 190.

Meanwhile, in FIG. 4, the switching unit SW is illustrated as being located on the printed circuit board 170, but the switching unit SW may be disposed on the plurality of flexible films 160, and the present disclosure is not limited thereto. A more detailed content of the switching unit SW will be described later with reference to FIGS. 7 to 9.

Hereinafter, structures of the plurality of contact units CE and the display panel 110 will be described in more detail with reference to FIG. 6.

Referring to FIG. 6, the display panel 110 includes a first substrate 111, a second substrate 112, a gate insulating layer 113, a passivation layer 114, an adhesive layer 115, a first planarization layer 116, a second planarization layer 117, a thin film transistor 120, the light emitting element 130, a first electrode 141, a second electrode 142, a reflective layer 143, a low potential power supply line VSS, signal lines 151, the link lines 152, side lines 153, and a side insulating layer IN.

The first substrate 111 is a substrate supporting components disposed on the display device 100 and may be an insulating substrate. For example, the first substrate 111 may be formed of glass or resin. Also, the first substrate 111 may be formed to include a polymer or plastic. In some aspects, the first substrate 111 may be formed of a plastic material having flexibility.

The active area AA and the non-active area NA surrounding the active area AA may be defined on the first substrate 111. However, in the present disclosure, it is described that the active area AA and the non-active area NA are defined on the first substrate 111, but as described above, the non-active area NA may be defined as not being present on the first substrate 111, and the present disclosure is not limited thereto.

The plurality of sub-pixels SP are defined in the active area AA of the first substrate 111, and the light emitting element 130 and the thin film transistor 120 are disposed in each of the plurality of sub-pixels SP.

First, the thin film transistor 120 is disposed on an upper surface of the first substrate 111. The thin film transistor 120 includes a gate electrode 121, an active layer 122, a source electrode 123 and a drain electrode 124.

The gate electrode 121 is disposed on the first substrate 111. The gate electrode 121 may be formed of a conductive material such as copper (Cu), aluminum (Al), molybdenum (Mo), nickel (Ni), titanium (Ti), chromium (Cr), or an alloy thereof. However, the present disclosure is not limited thereto.

The active layer 122 is disposed on the gate electrode 121. The active layer 122 may be formed of a semiconductor material such as an oxide semiconductor, amorphous silicon, or polysilicon, but the present disclosure is not limited thereto.

The gate insulating layer 113 is disposed between the gate electrode 121 and the active layer 122 to insulate the gate electrode 121 and the active layer 122. The gate insulating layer 113 may be formed of a single layer or multiple layers of silicon oxide (SiOx) or silicon nitride (SiNx), but the present disclosure is not limited thereto.

The source electrode 123 and the drain electrode 124 are disposed on the active layer 122. The source electrode 123 and the drain electrode 124 may be formed of a conductive material such as copper (Cu), aluminum (Al), molybdenum (Mo), nickel (Ni), titanium (Ti), chromium (Cr), or an alloy thereof, and the present disclosure is not limited thereto.

The passivation layer 114 for protecting the thin film transistor 120 is disposed on the source electrode 123 and the drain electrode 124. The passivation layer 114 may be formed of a single layer or multiple layers of silicon oxide (SiOx) or silicon nitride (SiNx), but the present disclosure is not limited thereto. However, the passivation layer 114 may be omitted according to aspects.

The low potential power line VSS is disposed on the gate insulating layer 113. The low potential power line VSS is a line for applying a low potential power voltage to the light emitting element 130. The low potential power line VSS may be formed of the same material as the source electrode 123 and the drain electrode 124 or the same material as the gate electrode 121, but the present disclosure is not limited thereto.

The reflective layer 143 is disposed on the passivation layer 114. The reflective layer 143 is a layer for reflecting light emitted toward the first substrate 111 from among light emitted from the light emitting element 130, upwardly of the display device 100 to emit the light to the outside of the display device 100. The reflective layer 143 may be formed of a metal material having high reflectivity.

The adhesive layer 115 is disposed on the reflective layer 143. The adhesive layer 115 is an adhesive layer 115 for bonding the light emitting element 130 onto the reflective layer 143, and may insulate the light emitting element 130 from the reflective layer 143 formed of a metal material. The adhesive layer 115 may be formed of a heat curing material or a light curing material, but the present disclosure is not limited thereto.

The light emitting element 130 is disposed on the adhesive layer 115. The light emitting element 130 includes an n-type layer 131, an light emitting layer 132, a p-type layer 133, an n-electrode 135, and a p-electrode 134. Hereinafter, it will be described that an LED having a lateral structure is used as the light emitting element 130, but the structure of the light emitting element 130 is not limited thereto.

First, the n-type layer 131 may be formed by implanting n-type impurities into gallium nitride (GaN) having excellent crystallinity. The light emitting layer 132 is disposed on the n-type layer 131. The light emitting layer 132 is a light emitting layer that emits light from the light emitting element 130 and may be formed of a nitride semiconductor, for example, indium gallium nitride (InGaN). The p-type layer 133 is disposed on the light emitting layer 132. The p-type layer 133 may be formed by implanting p-type impurities into gallium nitride (GaN). However, materials for constituting the n-type layer 131, the light emitting layer 132, and the p-type layer 133 are not limited thereto.

As described above, the light emitting element 130 is manufactured by a method of sequentially stacking the n-type layer 131, the light emitting layer 132, and the p-type layer 133, and then etching a predetermined portion thereof to form the n-electrode 135 and the p-electrode 134. In this case, the predetermined portion is a space for separating the n-electrode 135 and the p-electrode 134 from each other, and the predetermined portion may be etched to expose a portion of the n-type layer 131. In other words, surfaces of the light emitting element 130 on which the n-electrode 135 and the p-electrode 134 are to be disposed may have different height levels rather than having a flatten surface.

As such, the n-electrode 135 may be disposed on an etched region, that is, on the n-type layer 131 exposed through an etching process. The n-electrode 135 may be formed of a conductive material, for example, a transparent conductive oxide. Meanwhile, the p-electrode 134 may be disposed on an unetched region, that is, on the p-type layer 133. The p-electrode 134 may also be formed of a conductive material, for example, a transparent conductive oxide. Also, the p-electrode 134 may be formed of the same material as the n-electrode 135.

As described above, in a state where the n-type layer 131, the light emitting layer 132, the p-type layer 133, the n-electrode 135, and the p-electrode 134 are formed, the light emitting element 130 may be disposed such that the n-type layer 131 is closer to the reflective layer 143 than the n-electrode 135 and the p-electrode 134.

Subsequently, the first planarization layer 116 is disposed to planarize an upper portion of the thin film transistor 120 in the active area AA. The first planarization layer 116 may be formed to planarize an upper portion of an area excluding an area where the light emitting element 130 is disposed and contact holes.

The second planarization layer 117 is disposed on the first planarization layer 116. The second planarization layer 117 may be disposed over the thin film transistor 120 and the light emitting element 130 in an area excluding the contact holes. In this case, the second planarization layer 117 may be formed such that partial regions of the p-electrode 134 and the n-electrode 135 of the light emitting element 130 are open. In the present disclosure, it is described that the first planarization layer 116 and the second planarization layer 117 are used, but a single planarization layer may be used instead of a plurality of planarization layers, and the present disclosure is not limited thereto.

The first electrode 141 is an electrode for connecting the thin film transistor 120 and the p-electrode 134 of the light emitting element 130. The first electrode 141 is in contact with the source electrode 123 of the thin film transistor 120 through contact holes formed in the first planarization layer 116, the second planarization layer 117, the passivation layer 114, and the adhesive layer 115 and is in contact with the p-electrode 134 of the light emitting element 130 through a contact hole formed in the second planarization layer 117. However, the present disclosure is not limited thereto, and the first electrode 141 may be defined as being in contact with the drain electrode 124 of the thin film transistor 120 according to a type of the thin film transistor 120.

The second electrode 142 is an electrode for connecting the low potential power line VSS and the n-electrode 135 of the light emitting element 130. The second electrode 142 is in contact with the low potential power line VSS through contact holes formed in the first planarization layer 116, the second planarization layer 117, the passivation layer 114, and the adhesive layer 115, and is in contact with the n-electrode 135 of the light emitting element 130 through a contact hole formed in the second planarization layer 117.

Accordingly, when the display device 100 is turned on, different voltage levels respectively applied to the source electrode 123 of the thin film transistor 120 and the low potential power line VSS may be transmitted to the p-electrode 134 and the n-electrode 135 through the first electrode 141 and the second electrode 142, so that the light emitting element 130 may emit light.

The second substrate 112 is disposed under the first substrate 111. The second substrate 112 is a substrate supporting components disposed below the display device 100 and may be an insulating substrate. For example, the second substrate 112 may be formed of glass or resin. Also, the second substrate 112 may be formed to include a polymer or plastic. The second substrate 112 may be formed of the same material as the first substrate 111. In some aspects, the second substrate 112 may be formed of a plastic material having flexibility.

A bonding layer 118 is disposed between the first substrate 111 and the second substrate 112. The bonding layer 118 may be formed of a material capable of bonding the first substrate 111 and the second substrate 112 by being cured through various curing methods. The bonding layer 118 may be disposed on an entire area between the first substrate 111 and the second substrate 112 or may be disposed only on a partial area therebetween.

The signal lines 151 are disposed in the non-active area NA of the first substrate 111. The signal lines 151 are lines that transmit various signals to the plurality of sub-pixels SP of the active area AA. The signal lines 151 may extend from the active area AA toward the non-active area NA. The signal lines 151 extending from the active area AA to the non-active area NA may extend to an end of the first substrate 111. For example, the signal lines 151 may include gate lines, the data lines, the low potential power line VSS, a high potential power line, and the like, but the present disclosure is not limited thereto.

A plurality of the link lines 152 are disposed on a rear surface of the second substrate 112. The plurality of link lines 152 are lines for electrically connecting a plurality of the signal lines 151 formed on the upper surface of the first substrate 111 to the plurality of flexible films 160 and the printed circuit board 170 bonded onto the rear surface of the second substrate 112. The link line 152 may extend from an end of the second substrate 112 toward a center of the second substrate 112. One end of the link line 152 may be disposed at the end of the second substrate 112, and the other end of the link line 152 may be connected to the pad to which the plurality of flexible films 160 are bonded.

A plurality of the side lines 153 are disposed on the side surfaces of the display panel 110. The plurality of side lines 153 may connect the signal lines 151 formed on the upper surface of the first substrate 111 and the link lines 152 formed on the rear surface of the second substrate 112. For example, the plurality of side lines 153 may be formed by a printing method using a conductive paste, but the present disclosure is not limited thereto.

In this case, the plurality of sub-pixels SP disposed on the front surface of the display panel 110 and the plurality of flexible films 160 disposed on the rear surface of the display panel 110 may be electrically connected to each other through the side lines 153 connecting the front surface, the side surfaces and the rear surface of the display panel 110. For example, the pads to which the plurality of flexible films 160 are bonded are formed on the rear surface of the display panel 110, and the plurality of side lines 153 extending from the front surface of the display panel 110 to the side surfaces and the rear surface of the display panel 110 may be connected to both the signal lines 151 connected to the plurality of sub-pixels SP and the link lines 152 connected to the pads, so that the plurality of sub-pixels SP and the plurality of flexible films 160 may be electrically connected.

The side insulating layer IN covering the plurality of side lines 153 is disposed. The side insulating layer IN may be formed to cover the side lines 153 on the upper surface of the first substrate 111, side surfaces of the first substrate 111 and the second substrate 112, and the rear surface of the second substrate 112. The side insulating layer IN may protect the plurality of side lines 153 and insulate the plurality of side lines 153 from the plurality of contact units CE.

Meanwhile, when the plurality of side lines 153 are formed of a metal material, external light is reflected from the plurality of side lines 153 or a defect in which light emitted from the light emitting element 130 is reflected from the plurality of side lines 153 and is visible to a user may occur. Accordingly, the side insulating layer IN is configured to include a black material, so that reflection of external light may be suppressed.

The plurality of contact units CE are disposed on the side insulating layer IN on the side surface of the display panel 110. As illustrated in FIG. 1, the contact units CE disposed on the side insulating layer IN on the side surface of the display panel 110 may contact the contact units CE of the adjacent display devices 100 when forming the tiling display device TD. In this case, considering that the plurality of contact units CE are electrodes selectively connected to the first metal cover 180 and the second metal cover 190, and the plurality of side lines 153 are lines through which various signals are transmitted, the side insulating layer IN may be formed between the plurality of contact units CE and the plurality of side lines 153 to insulate the plurality of contact units CE and the plurality of side lines 153.

Meanwhile, although not illustrated in the drawings, the connection line CL connected to the plurality of contact units CE may also be formed on the side insulating layer IN. The connection line CL may be formed on the side insulating layer IN on the side surface of the display panel 110 to connect the plurality of contact units CE to each other. In addition, a portion of the connection line CL may extend toward the rear surface of the second substrate 112, and may be connected to the switching unit SW located on the plurality of flexible films 160 and the printed circuit board 170 through the pads on the rear surface of the second substrate 112.

In the drawings, for convenience of description, each of the plurality of contact units CE is illustrated as having a certain thickness, but the plurality of contact units CE are electrodes having a very thin thickness and thus, an impact thereof on distances between the plurality of display devices 100 may be minor. That is, since the plurality of contact units CE has a very thin thickness, an increase in the distances between the plurality of display devices 100 due to the plurality of contact units CE may be minimized.

Hereinafter, a connection method of the ground structures according to operations of the switching units SW in the tiling display device TD will be described with reference to FIGS. 7 to 9.

Figure 7:
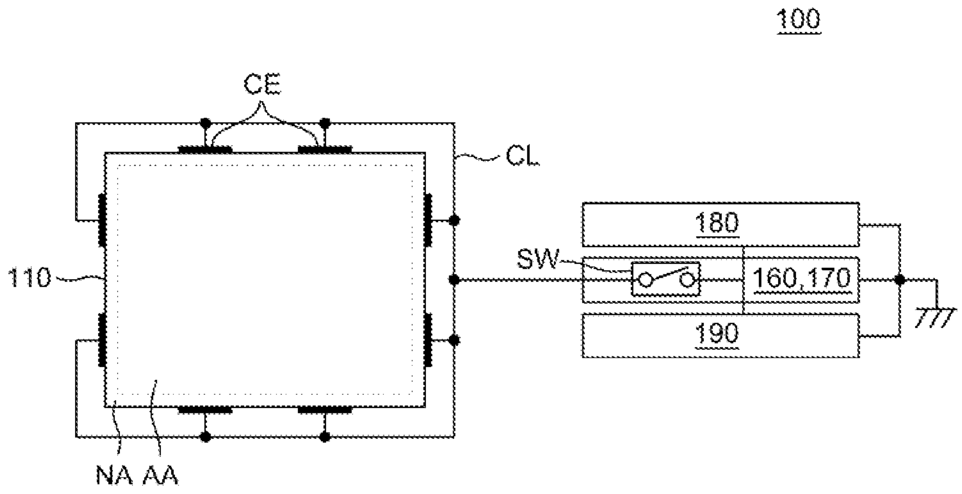
FIG. 7 is a schematic configuration diagram between a switching unit and a plurality of contact units of the display device according to an exemplary aspect of the present disclosure.

FIG. 7 is a schematic configuration diagram between the switching unit and the plurality of contact units of the display device according to an exemplary aspect of the present disclosure. FIGS. 8 and 9 are plan views of the tiling display device according to an exemplary aspect of the present disclosure. Specifically, FIG. 8 is a diagram illustrating a ground plane GNDS when all of the switching units SW of the plurality of display devices 100 are turned on in the tiling display device TD according to an exemplary aspect of the present disclosure. FIG. 9 is a diagram illustrating the ground plane GNDS when all of the switching units SW of the plurality of display devices 100 are turned off. In FIGS. 8 and 9, for convenience of description, the contact units CE electrically connected to the first metal cover 180 and the second metal cover 190 are indicated by black hatching, and the contact units CE electrically separated from the first metal cover 180 and the second metal cover 190 and in floating are illustrated only as dotted lines without hatching.

Referring to FIG. 7, the plurality of contact units CE disposed on one display device 100 may be connected to the switching unit SW through the connection line CL. The switching unit SW may be disposed on the plurality of flexible films 160 or the printed circuit board 170. The connection line CL may be connected to the switching unit SW disposed on the plurality of flexible films 160 or the printed circuit board 170 through a plurality of the pads formed on the rear surface of the display panel 110.

The switching unit SW may selectively connect the plurality of contact units CE to the first metal cover 180 and the second metal cover 190 functioning as panel grounds. For example, when the switching unit SW is turned on, the plurality of contact units CE may be connected to the first metal cover 180 and the second metal cover 190 through the switching unit SW and be grounded. Conversely, when the switching unit SW is turned off, the plurality of contact units CE may be separated from the first metal cover 180 and the second metal cover 190 and be floating. Therefore, by controlling the switching unit SW to selectively connect the plurality of contact units CE and the first metal cover 180 and the second metal cover 190, the plurality of contact units CE may be in floating or may be grounded.

The ground structures between the plurality of display devices 100 constituting the tiling display device TD may be selectively connected using the switching units SW. For example, in a pair of display devices 100 adjacent to each other and having contact units CE in contact with each other, when the switching units SW are turned on, the first metal covers 180 and the second metal covers 190 of the pair of respective display devices 100 may be electrically connected to each other. Conversely, when the switching units SW are turned off in the pair of display devices 100 in which the contact units CE are in contact with each other, each of the contact units CE is floating and thus, the first metal covers 180 and the second metal covers 190 of the pair of respective display devices 100 may be electrically separated from each other.

Figure 8:
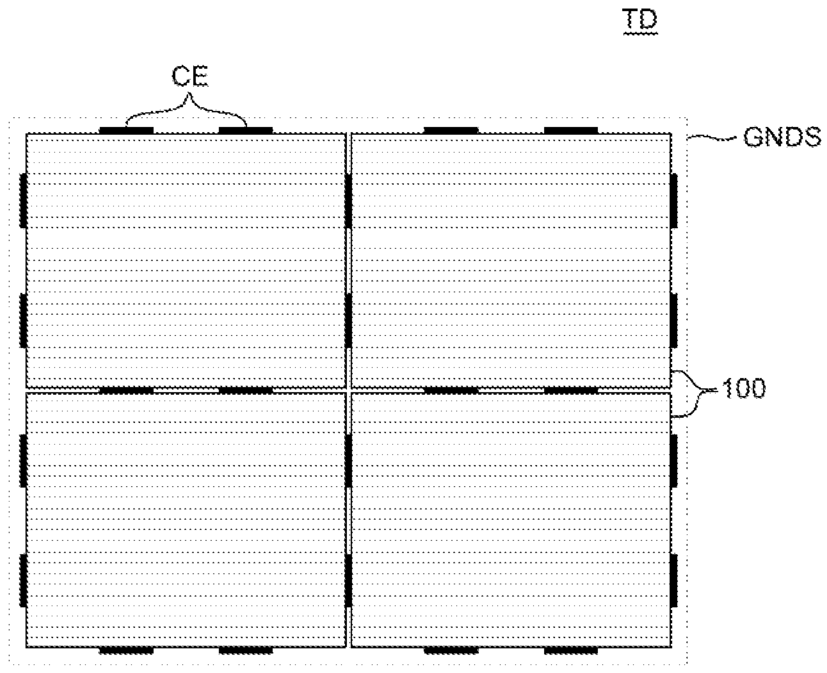
FIGS. 8 and 9 are plan views of the tiling display device according to an exemplary aspect of the present disclosure.

For example, referring to FIG. 8, when the switching units SW are turned on in all of the plurality of display devices 100, the plurality of contact units CE between the plurality of display devices 100 are connected to the first metal covers 180 and the second metal covers 190 of the plurality of respective display devices 100. Also, the first metal cover 180 and the second metal cover 190 of each of the plurality of display devices 100 may be connected to the first metal cover 180 and the second metal cover 190 of another display device 100 through the plurality of contact units CE. Accordingly, the first metal covers 180 and the second metal covers 190 of the plurality of respective display devices 100 are connected to each other through the plurality of contact units CE, so one ground plane GNDS having a shape corresponding to an entirety of the plurality of display devices 100 may be formed. For example, when the switching units SW are turned on in all of four display devices 100, the first metal covers 180 and the second metal covers 190 of the four display devices 100 are connected to each other through the contact units CE, so that the panel grounds of the four display devices 100 may be connected together and one ground plane GNDS and one antenna corresponding to the four display devices 100 may be formed. Therefore, when the switching units SW are turned on, the first metal covers 180 and the second metal covers 190, which are ground structures of the plurality of respective display devices 100, may be connected to each other, thereby reducing a panel ground potential difference.

Figure 9:
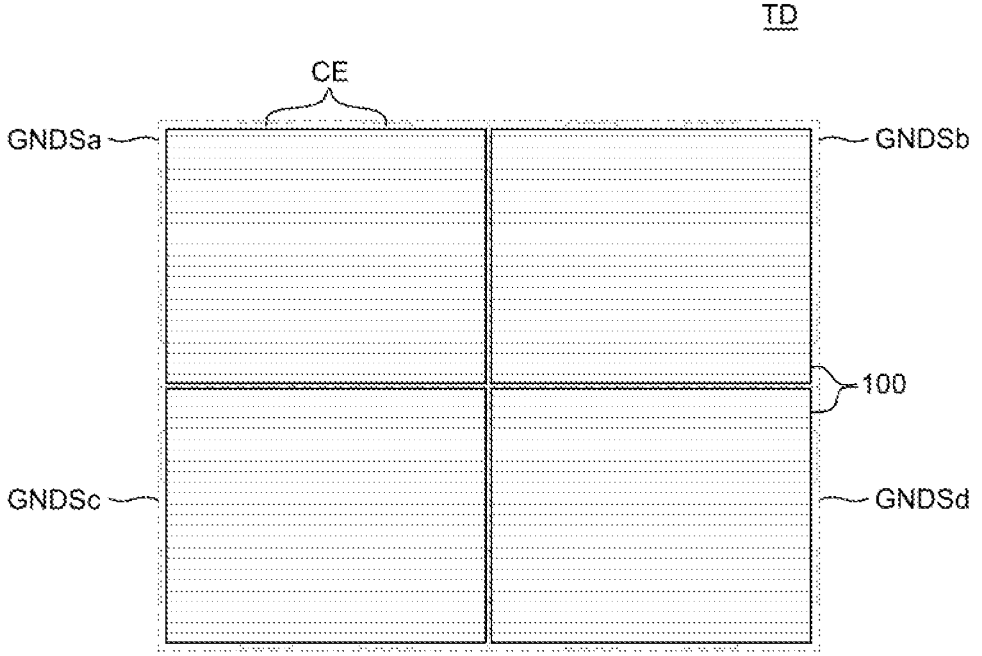

Referring to FIG. 9, when the switching units SW are turned off in all of the plurality of display devices 100, the plurality of contact units CE between the plurality of display devices 100 may be electrically separated from the first metal covers 180 and the second metal covers 190 of the plurality of respective display devices 100. The first metal cover 180 and the second metal cover 190 of each of the plurality of display devices 100 may be electrically separated from the first metal cover 180 and the second metal cover 190 of another display device 100. The first metal cover 180 and the second metal cover 190 of one display device 100 may not be electrically connected to the first metal cover 180 and the second metal cover 190 of the other display device 100. For example, when the switching units SW are turned off in all of four display devices 100, the first metal covers 180 and the second metal covers 190 of the four display devices 100 may maintain a state in which they are separated, and four ground planes GNDS and four antennas respectively corresponding to the four display devices 100 may be formed. That is, a first ground plane GNDSa corresponding to the display device 100 at an upper left, a second ground plane GNDSb corresponding to the display device 100 at an upper right, a third ground plane GNDSc corresponding to the display device 100 at a lower left, and a fourth ground plane GNDSd corresponding to the display device 100 at a lower right may be independently formed. That is, each display device 100 may have a different panel ground. Therefore, when the switching units SW are turned off, the first metal covers 180 and the second metal covers 190 of the plurality of display devices 100 are electrically separated from each other, so that a plurality of ground planes GNDSa, GNDSb, GNDSc and GNDSd respectively corresponding to the plurality of display devices 100 may be formed.

Meanwhile, although not illustrated in the drawings, an RC filter may be further disposed between the switching unit SW and the first metal cover 180 and the second metal cover 190. The RC filter connected to the first metal cover 180 and the second metal cover 190 may be formed to more stably control signal noise, but the present disclosure is not limited thereto.

Therefore, in the display devices 100 and the tiling display device TD according to an exemplary aspect of the present disclosure, by connecting the first metal covers 180 and the second metal covers 190 of the plurality of respective display devices 100 constituting the tiling display device TD, it is possible to reduce signal noise by minimizing a potential difference between panel grounds. Each of the plurality of display devices 100 includes the first metal cover 180 and the second metal cover 190 that are metal elements as ground structures. However, the ground structure is also a kind of signal source, and when the plurality of respective display devices 100 have independent ground structures, a potential difference between panel grounds may occur in the plurality of respective display devices 100. In addition, this potential difference may cause another signal noise, and thus driving reliability of the tiling display device TD may be degraded. Accordingly, the plurality of contact units CE connected to the first metal covers 180 and the second metal covers 190 are formed on the side surfaces of the plurality of display devices 100, and through the plurality of contact units CE, the first metal covers 180 and the second metal covers 190 of the plurality of respective display devices 100 may be electrically connected to each other. Therefore, in the display devices 100 and the tiling display device TD according to an exemplary aspect of the present disclosure, the plurality of contact units CE are formed between the plurality of display devices 100 so that the panel grounds of the plurality of respective display devices 100 may be electrically connected, and a potential difference between the plurality of display devices 100 may be minimized.

Meanwhile, as described above, signal noise due to electromagnetic interference may include noise generated when an output of a channel is made and noise formed along a path through which a signal passes. Of these, noise formed along a signal path may have different noise characteristics for each frequency depending on a length or shape of the path. In this case, the noise for each frequency may be amplified or reduced according to a shape of an antenna. For example, the shape of an antenna that reduces noise of a specific frequency and the shape of an antenna that reduces noise of other frequencies may be different from each other. Therefore, with a fixed connection structure of ground structures, that is, a fixed antenna shape, it is possible to cope with signal noise of only some frequencies.

Accordingly, in the display devices 100 and the tiling display device TD according to an exemplary aspect of the present disclosure, the shape of an antenna radiating signal noise may be controlled variously according to characteristics of each frequency of signal noise. Specifically, signal noise characteristics may vary depending on the number of display devices 100 constituting the tiling display device TD, connection structures thereof, and specifications of the respective display devices 100. In this case, the first metal covers 180 and the second metal covers 190 of the plurality of respective display devices 100 may be connected to each other by using the plurality of contact units CE formed on the side surfaces of each of the plurality of display devices 100 constituting the tiling display device TD. For example, the switching units SW are turned on to connect the first metal covers 180 and the second metal covers 190 of the plurality of display devices 100 to each other to form a single antenna corresponding to an entire tiling display device TD. By turning off the switching units SW, the first metal covers 180 and the second metal covers 190 of the plurality of respective display devices 100 are electrically separated from each other, and a plurality of antennas corresponding to the plurality of respective display devices 100 may be formed. Therefore, in the display devices 100 and the tiling display device TD according to an exemplary aspect of the present disclosure, the switching units SW are turned on or off to vary connection structures of the first metal covers 180 and the second metal covers 190 between the plurality of display devices 100, and antenna structures may be variously implemented in consideration of characteristics of signal noise for each frequency.

Figure 10:
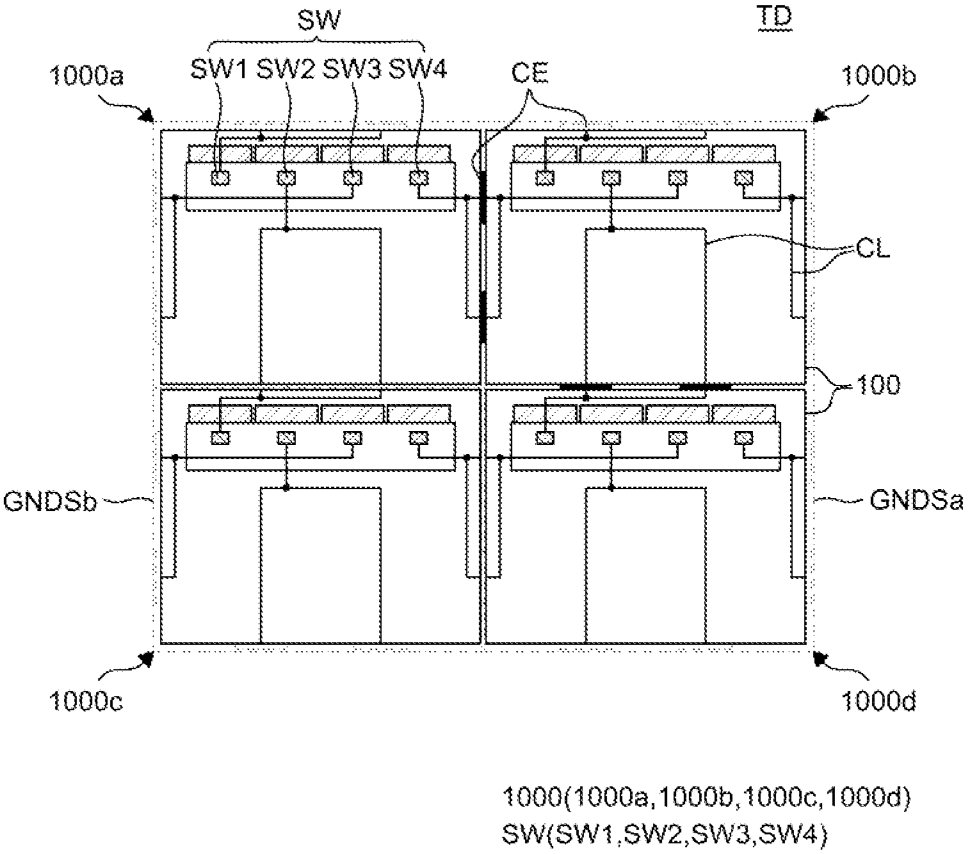
FIG. 10 is a schematic rear view of display devices and a tiling display device according to another exemplary aspect of the present disclosure.

FIG. 10 is a schematic rear view of display devices and a tiling display device according to another exemplary aspect of the present disclosure. Since other configurations of display devices 1000 of FIG. 10 are substantially the same as those of the display devices 100 of FIGS. 1 to 9 except for switching units SW, duplicate descriptions thereof will be omitted. In FIG. 10, the first metal cover 180 and the second metal cover 190 are omitted for convenience of description.

Referring to FIG. 10, a plurality of the switching units SW connected to the plurality of contact units CE are disposed on the printed circuit board 170. Each of the plurality of switching units SW may be connected to at least one contact unit CE. The plurality of switching units SW include a first switching unit SW1, a second switching unit SW2, a third switching unit SW3, and a fourth switching unit SW4 that are connected to different contact units CE.

For example, the first switching unit SW1 may be connected to two contact units CE located on an upper side surface of the display device 1000, the second switching unit SW2 may be connected to two contact units CE located on a lower side surface of the display device 1000, the third switching unit SW3 may be connected to two contact units CE located on a left side surface of the display device 1000, and the fourth switching unit SW4 may be connected to two contact units CE located on a right side surface of the display device 1000. Accordingly, the contact units CE disposed on the upper, lower, left, and right side surfaces of the display device 1000 may be connected to different switching units SW and independently controlled.

When the plurality of display devices 1000 constituting the tiling display device TD include a first display device 1000*a* at an upper left, a second display device 1000*b* at an upper right, a third display device 1000*c* at a lower left, and a fourth display device 1000*d* at a lower right, each of the switching units SW of the first display device 1000*a*, the second display device 1000*b*, the third display device 1000*c*, and the fourth display device 1000*d* may be controlled so that the plurality of display devices 1000 may be selectively connected.

For example, when only the first metal covers 180 and the second metal covers 190 of the first display device 1000*a*, the second display device 1000*b*, and the fourth display device 1000*d* are connected, only the fourth switching unit SW4 of the first display device 1000*a*, the second and third switching units SW2 and SW3 of the second display device 1000*b*, and the first switching unit SW1 of the fourth display device 1000*d* may be turned on. Specifically, when the fourth switching unit SW4 connected to the contact unit CE on a right side surface of the first display device 1000*a* and the third switching unit SW3 connected to the contact unit CE on a left side surface of the second display device 1000*b* are turned on, the first metal cover 180 and the second metal cover 190 of the first display device 1000*a* and the first metal cover 180 and the second metal cover 190 of the second display device 1000*b* may be connected to each other through the contact units CE on the right side surface of the first display device 1000*a* and the contact units CE on the left side surface of the second display device 1000*b*. In addition, when the second switching unit SW2 connected to the contact unit CE on a lower side surface of the second display device 1000*b* and the first switching unit SW1 connected to the contact unit CE on an upper side surface of the fourth display device 1000*d* are turned on, the first metal covers 180 and the second metal covers 190 of the second display device 1000*b* and the first metal covers 180 and the second metal covers 190 of the fourth display device 1000*d* may be connected to each other through the contact unit CE on the lower side surface of the second display device 1000*b* and the contact unit CE on the upper side surface of the fourth display device 1000*d*. Therefore, an antenna of the tiling display device TD may be configured to have a first ground plane GNDSa having a '¬'-shape that is formed by connecting the first metal covers 180 and the second metal covers 190 of the first display device 1000*a*, the second display device 1000*b*, and the fourth display device 1000*d*, and a second ground plane GNDSb corresponding to the third display device 1000*c*.

Therefore, in the display devices 1000 and the tiling display device TD according to another exemplary aspect of the present disclosure, respective contact units CE of the plurality of contact units CE are connected to different switching units SW, so that connection structures between the display devices 1000 may be implemented in more diverse ways. Specifically, one display device 1000 may be selectively connected to other display devices 1000 disposed on upper, lower, left, and right sides of the one display device 1000 by connecting the contact units CE disposed on four sides of the display device 1000 to the different switching units SW. For example, only the fourth switching unit SW4 connected to the contact unit CE disposed on the right side surface of the first display device 1000*a* and the third switching unit SW3 connected to the contact unit CE located on the left side surface of the second display device 1000*b* may be turned on to electrically connect only the first metal covers 180 and the second metal covers 190 of the first display device 1000*a* and the second display device 1000*b*. Therefore, the connection structures of the ground structures between the plurality of display devices 1000 arranged in a matrix form may be varied by connecting the plurality of contact units CE disposed on the four sides of the display device 1000 to different switching units SW. Therefore, in the display devices 1000 and the tiling display device TD according to another exemplary aspect of the present disclosure, various antenna structures are formed by connecting respective contact units CE of the plurality of contact units CE to different switching units SW, so that signal noise of various frequencies may be effectively controlled.

Figure 11:
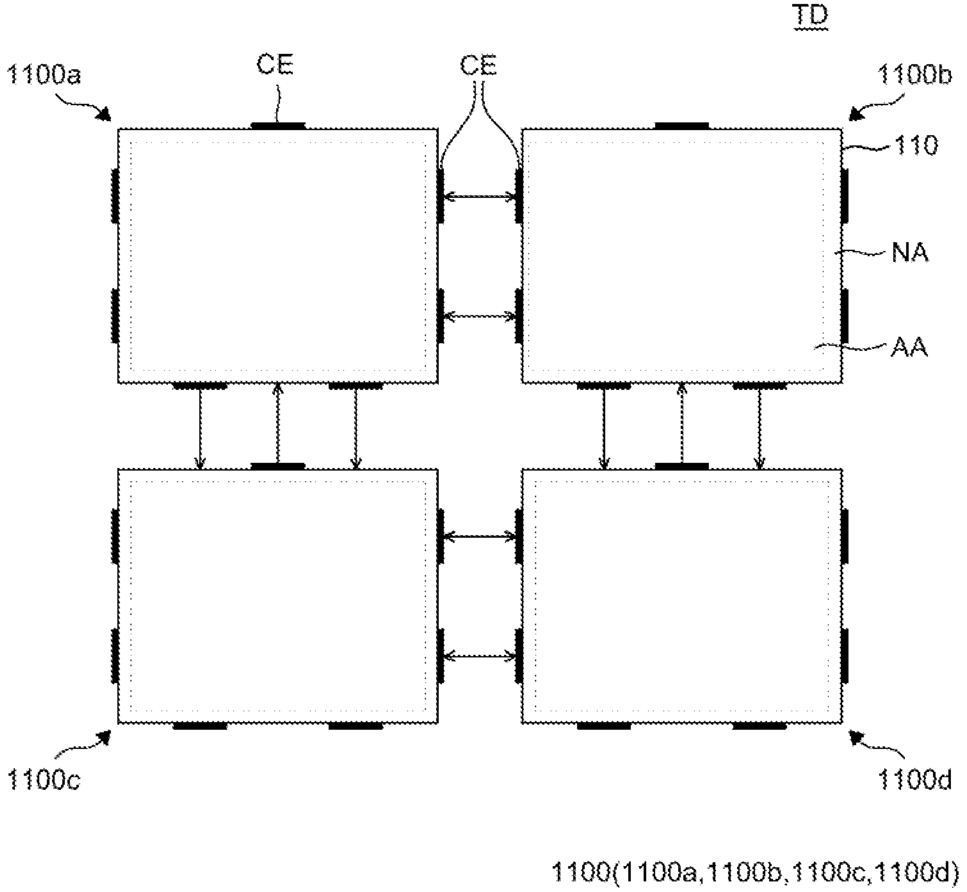
FIG. 11 is a plan view of display devices and a tiling display device according to still another exemplary aspect of the present disclosure.

FIG. 11 is a plan view of display devices and a tiling display device according to still another exemplary aspect of the present disclosure. Since other configurations of display devices 1100 of FIG. 11 are substantially the same as the display devices 100 of FIGS. 1 to 9 except for a plurality of contact units CE, duplicate descriptions will be omitted.

Referring to FIG. 11, each of the plurality of display devices 1100 constituting one tiling display device TD includes a plurality of contact units CE. At least some of the plurality of contact units CE disposed on one display device 1100 may be disposed in an asymmetrical structure with the contact units CE of adjacent display devices 1100.

For example, the plurality of contact units CE disposed on each of the plurality of display devices 1100 may include one contact unit CE disposed at a center of an upper side surface of the display device 1100, two contact units CE disposed on a lower side surface of the display device 1100, and two contact units CE disposed on left and right side surfaces of the display device 1100.

In this case, since the number and positions of the contact units CE disposed on the upper and lower side surfaces of each of the plurality of display devices 1100 are different, one display device 1100 may be selectively connected only to ground structures of the display devices 1100 disposed on the left and the right thereof among the adjacent display devices 1100. For example, the contact units CE on a right side surface of a first display device 1100*a* disposed on an upper left may contact and correspond to the contact units CE on a left side surface of a second display device 1100*b* disposed on an upper right, among the plurality of display devices 1100. Accordingly, in the first display device 1100*a* and the second display device 1100*b*, the first metal covers 180 and the second metal covers 190 may be connected to each other through the contact units CE on the right and left side surfaces thereof. On the other hand, the contact units CE on a lower side surface of the first display device 1100*a* may not correspond to and may be disposed to be offset from the contact units CE on an upper side surface of the third display device 1100*c* at a lower left among the plurality of display devices 1100. Also, the contact unit CE on a lower side surface of the second display device 1100*b* and the contact unit CE on an upper side surface of the fourth display device 1100*d* may be disposed to be offset from each other. Therefore, the first display device 1100*a* and the third display device 1100*c*, and the second display device 1100*b* and the fourth display device 1100*d* are disposed adjacent to each other, but the contact units CE thereof are disposed to be offset from each other so that they cannot be connected to each other.

Meanwhile, although FIG. 11 shows that the plurality of contact units CE disposed on upper and lower side surfaces of each of the plurality of display devices 1100 have an asymmetrical structure, the plurality of contact units CE on the left and right side surfaces may be formed in an asymmetrical structure, and the contact units CE in the asymmetrical structure may be formed only in some of the display devices 1100 among the plurality of display devices 1100, but the present disclosure is not limited thereto.

Therefore, in the display devices 1100 and the tiling display device TD according to still another exemplary aspect of the present disclosure, the plurality of contact units CE between adjacent display devices 1100 are formed in a symmetrical or asymmetrical structure. The first metal covers 180 and the second metal covers 190 of the plurality of display devices 1100 may be selectively connected. For example, when only the first metal covers 180 and the second metal covers 190 of the display devices 1100 adjacent to each other in a row direction are to be connected to each other, the plurality of contact units CE disposed on the left side surface and the right side surface of each of the plurality of display devices 1100 may be formed in a symmetrical structure, and the plurality of contact units CE disposed on the upper and lower side surfaces of each of the plurality of display devices 1100 may be formed in an asymmetrical structure. In addition, when a plurality of the display devices 1100 are disposed to form the tiling display device TD, the display devices 1100 adjacent to each other in the row direction may be connected to each other through the contact units CE in the symmetrical structure, but the display devices 1100 adjacent to each other in a column direction may not be connected to each other through the contact units CE in the asymmetric structure. Therefore, in the display devices 1100 and the tiling display device TD according to still another exemplary aspect of the present disclosure, by varying positions of the plurality of contact units CE, the plurality of switching units SW may be omitted or simplified, and a connection relationship of the first metal covers 180 and the second metal covers 190 between the plurality of display devices 1100 may be controlled.

Figure 12:
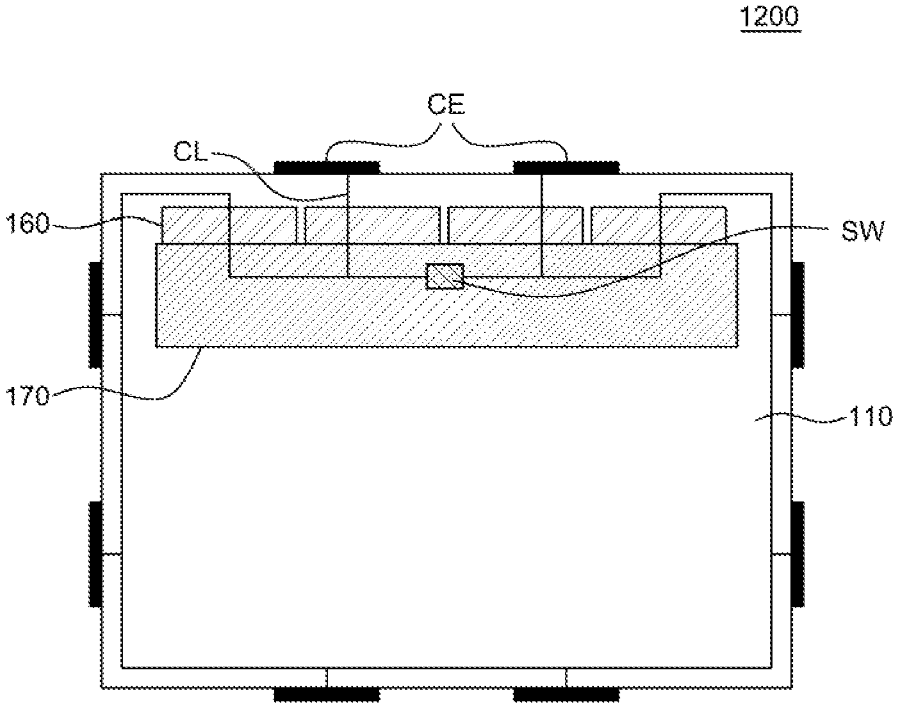
FIG. 12 is a rear view of a display device according to still another exemplary aspect of the present disclosure.
Figure 13:
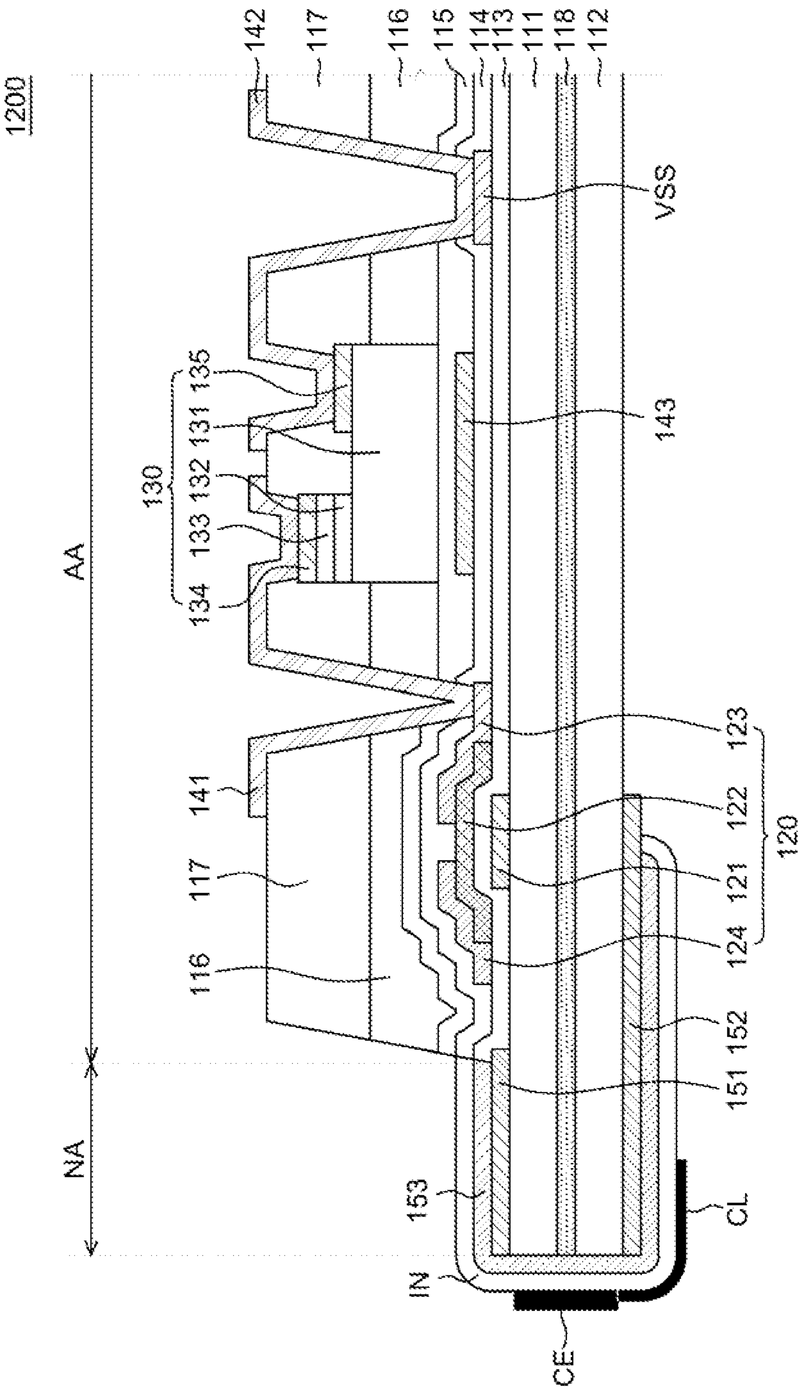
FIG. 13 is a cross-sectional view of the display device according to still another exemplary aspect of the present disclosure.

FIG. 12 is a rear view of a display device according to still another exemplary aspect of the present disclosure. FIG. 13 is a cross-sectional view of the display device according to still another exemplary aspect of the present disclosure. Since other configurations of a display device 1200 of FIGS. 12 and 13 are substantially the same as the display device 100 of FIGS. 1 to 9 except for a connection line CL, duplicate descriptions will be omitted.

Referring to FIGS. 12 and 13, the connection line CL connecting the plurality of contact units CE and the switching unit SW are disposed on the rear surface of the display panel 110. The connection line CL may be disposed on the rear surface of the second substrate 112 to correspond to the non-active area NA of the display panel 110. The connection line CL may extend from the rear surface of the display panel 110 along an edge of the display panel 110. Also, a portion of the connection line CL may extend from the rear surface of the display panel 110 toward the side surfaces of the display panel 110 and be connected to each of the plurality of contact units CE on the side surfaces of the display panel 110.

Meanwhile, although not illustrated in the drawings, the connection line CL may be disposed not to interfere with the first metal cover 180 disposed on the rear surface of the display panel 110. For example, the first metal cover 180 is configured to have a size smaller than that of the second substrate 112 of the display panel 110, and the connection line CL may be disposed on the rear surface of the second substrate 112 protruding outward from the first metal cover 180. For another example, when the connection line CL and the first metal cover 180 overlap with each other, a separate insulating layer is formed between the connection line CL and the first metal cover 180, so that direct connection between the first metal cover 180 and the connection line CL instead of the switching unit SW may be prevented.

Therefore, in the display device 1200 and the tiling display device TD according to still another exemplary aspect of the present disclosure, the connection line CL connecting each of the plurality of contact units CE to the switching unit SW may be formed on the rear surface of the display panel 110. Specifically, one display device 1200 includes the plurality of contact units CE formed on the side surface of the display panel 110 to contact the contact units CE of another display device 1200. Also, the plurality of contact units CE may be connected to the switching unit SW through the connection line CL. In this case, the connection line CL may be formed on the rear surface of the display panel 110 to connect the plurality of contact units CE on the side surface of the display panel 110 and the switching unit SW on the rear surface of the display panel 110. In this case, the connection line CL may be easily disposed by utilizing a free space on the rear surface of the display panel 110. Therefore, in the display device 1200 and the tiling display device TD according to still another exemplary aspect of the present disclosure, positions of the plurality of contact units CE are not limited, and the connection line CL is formed using the free space on the rear surface of the display panel 110, so that a degree of freedom in design may be improved.

Figure 14:
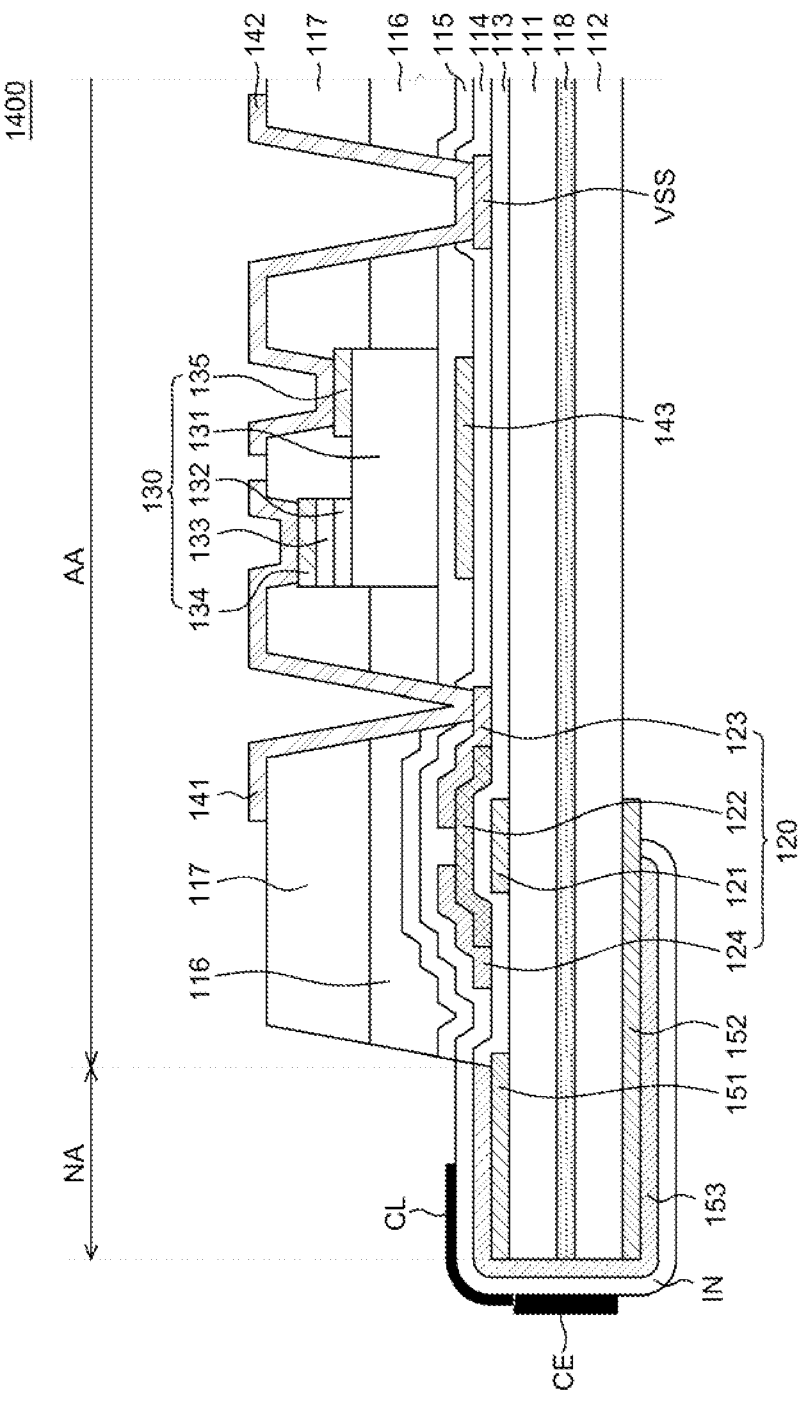
FIG. 14 is a cross-sectional view of a display device according to still another exemplary aspect of the present disclosure.

FIG. 14 is a cross-sectional view of a display device according to still another exemplary aspect of the present disclosure. Since other configurations of a display device 1400 of FIG. 14 are substantially the same as the display device 1200 of FIGS. 12 and 13 except for a connection line CL, duplicate descriptions will be omitted.

Referring to FIG. 14, the connection line CL connecting the plurality of contact units CE and the switching unit SW is disposed on the front surface of the display panel 110. The connection line CL may be disposed on the front surface of the first substrate 111 to correspond to the non-active area NA of the display panel 110. The connection line CL may extend from the front surface of the display panel 110 along the edge of the display panel 110. Also, a portion of the connection line CL may extend from the front surface of the display panel 110 toward the side surface of the display panel 110 and be connected to each of the plurality of contact units CE on the side surface of the display panel 110.

Therefore, in the display device 1400 and the tiling display device TD according to still another exemplary aspect of the present disclosure, the connection line CL connecting each of the plurality of contact units CE to the switching unit SW may be formed on the front surface of the display panel 110. The connection line CL may be formed in the non-active area NA adjacent to an edge of the front surface of the display panel 110, that is, in a free space, and connected to the plurality of contact units CE on the side surface of the display panel 110. The connection line CL may be easily disposed by utilizing the free space on the front surface of the display panel 110. In addition, since the first metal cover 180 on the rear surface of the display panel 110 and the connection line do not interfere with each other, a degree of freedom in design of the connection line CL may be further improved. Therefore, in the display device 1400 and the tiling display device TD according to still another exemplary aspect of the present disclosure, positions of the plurality of contact units CE are not limited and the connection line CL is formed by utilizing the free space on the front surface of the display panel 110, so that a degree of freedom in design may be improved.

The exemplary aspects of the present disclosure may also be described as follows:

A display device according to an exemplary aspect of the present disclosure includes a display panel; a plurality of contact units disposed on side surfaces of the display panel; a metal cover disposed on a rear surface of the display panel and grounded; and a connection line disposed between the metal cover and the plurality of contact units.

The connection line may be disposed along the side surfaces of the display panel.

The connection line may be disposed on the rear surface of the display panel, and a portion of the connection line may extend from the rear surface of the display panel toward the side surfaces of the display panel and may be connected to the plurality of contact units.

The connection line may be disposed on a front surface of the display panel, and a portion of the connection line may extend from the front surface of the display panel toward the side surfaces of the display panel and may be connected to the plurality of contact units.

The display device may further include a switching unit connected between the connection line and the metal cover, when the switching unit is turned on, the plurality of contact units may be electrically connected to the metal cover, and when the switching unit is turned off, the plurality of contact units may be floating.

The display device may further include a plurality of flexible films electrically connected to one end of the display panel; and a printed circuit board electrically connected to the plurality of flexible films, the switching unit is disposed on any one of the plurality of flexible films and the printed circuit board.

The metal cover may include a first metal cover disposed on the rear surface of the display panel and having an opening; and a second metal cover covering the plurality of flexible films and the printed circuit board, one end of each of the plurality of flexible films are bonded to the rear surface of the display panel exposed through the opening, and the plurality of flexible films and the printed circuit board are disposed between the first metal cover and the second metal cover.

The switching unit may include a plurality of switching units, a portion of the plurality of contact units may be connected to one of the plurality of switching units, and another portion of the plurality of contact units may be connected to another one of the plurality of switching units.

A tiling display device according to another exemplary aspect of the present disclosure includes a plurality of display devices arranged in a tile form; and a plurality of contact units disposed on side surfaces of each of the plurality of display devices, each of the plurality of display devices includes, a display panel having the plurality of contact units disposed on the side surfaces thereof; and a metal cover disposed on a rear surface of the display panel, wherein the metal covers of the plurality of display devices are connected to each other selectively through the plurality of contact units. For example, each of the plurality of display devices may further include a switching unit for selectively connecting the plurality of contact units and the metal cover.

The plurality of contact units of each of the plurality of display devices may be in contact with the plurality of contact units of the display devices adjacent thereto in a symmetrical structure.

At least some of the plurality of contact units of each of the plurality of display devices may be disposed to be offset from the plurality of contact units of the display devices adjacent thereto in an asymmetrical structure.

The plurality of display devices may include a first display device and a second display device that are disposed adjacent to each other and have the plurality of contact units disposed on the side surfaces thereof and contacting each other, when the switching unit of the first display device and the switching unit of the second display device are turned on, the metal cover of the first display device and the metal cover of the second display device may be electrically connected to each other through the plurality of contact units.

When the switching unit of the first display device and the switching unit of the second display device are turned off, the plurality of contact units may be floating, and the metal cover of the first display device and the metal cover of the second display device may be electrically separated from each other.

In one display device among the plurality of display devices, the plurality of contact units may be connected to one switching unit.

In one display device among the plurality of display devices, the switching unit may include a plurality of switching units, and each of the plurality of contact units may be connected to a different switching unit among the plurality of switching units.

The plurality of switching units may include a first switching unit connected to a contact unit disposed on an upper side surface of the display panel among the plurality of contact units; a second switching unit connected to a contact unit disposed on a lower side surface of the display panel among the plurality of contact units; a third switching unit connected to a contact unit disposed on a left side surface of the display panel among the plurality of contact units; and a fourth switching unit connected to a contact unit disposed on a right side surface of the display panel among the plurality of contact units.

Only the metal covers of vertically adjacent display devices among the plurality of display devices may be electrically connected to each other when only the first switching unit and the second switching unit of each of the plurality of display devices are turned on.

Only the metal covers of left and right adjacent display devices among the plurality of display devices may be electrically connected to each other when only the third switching unit and the fourth switching unit of each of the plurality of display devices are turned on.

It will be apparent to those skilled in the art that various modifications and variations can be made in the display device and the tiling display device of the present disclosure without departing from the spirit or scope of the aspects. Thus, it is intended that the present disclosure covers the modifications and variations of the aspects provided they come within the scope of the appended claims and their equivalents.

What is claimed is:

1. A display device, comprising:

a display panel;

a plurality of contact units disposed on side surfaces of the display panel;

a metal cover disposed on a rear surface of the display panel and grounded;

a connection line disposed between the metal cover and the plurality of contact units; and a switching unit connected between the connection line and the metal cover, when the switching unit is turned on, the plurality of contact units are electrically connected to the metal cover, and when the switching unit is turned off, the plurality of contact units are floating.

2. The display device of claim 1, wherein the connection line is disposed along the side surfaces of the display panel.

3. The display device of claim 1, wherein the connection line is disposed on the rear surface of the display panel, and a portion of the connection line extends from the rear surface of the display panel toward the side surfaces of the display panel and is connected to the plurality of contact units.

4. The display device of claim 1, wherein the connection line is disposed on a front surface of the display panel, and a portion of the connection line extends from the front surface of the display panel toward the side surfaces of the display panel and is connected to the plurality of contact units.

5. The display device of claim 1, further comprising:

a plurality of flexible films electrically connected to one end of the display panel; and a printed circuit board electrically connected to the plurality of flexible films, wherein the switching unit is disposed on one of the plurality of flexible films and the printed circuit board.

6. The display device of claim 5, wherein the metal cover includes:

a first metal cover disposed on the rear surface of the display panel and having an opening; and a second metal cover covering the plurality of flexible films and the printed circuit board, wherein one end of each of the plurality of flexible films is bonded to the rear surface of the display panel exposed through the opening, and the plurality of flexible films and the printed circuit board are disposed between the first metal cover and the second metal cover.

7. The display device of claim 1, wherein the switching unit includes a plurality of switching units, wherein the plurality of contact units has a portion connected to one of the plurality of switching units, and wherein the plurality of contact units has another portion connected to another one of the plurality of switching units.

8. A tiling display device, comprising:

a plurality of display devices arranged in a tile form; and a plurality of contact units disposed on side surfaces of each of the plurality of display devices, wherein each of the plurality of display devices includes:

a display panel having the plurality of contact units disposed on the side surfaces thereof;

a metal cover disposed on a rear surface of the display panel; and a switching unit for selectively connecting the plurality of contact units and the metal cover, wherein the metal covers of the plurality display devices are connected to each other selectively through the plurality of contact units.

9. The tiling display device of claim 8, wherein the metal cover of each of the plurality of display devices is grounded.

10. The tiling display device of claim 8, wherein the plurality of contact units of each of the plurality of display devices are in contact with the plurality of contact units of the display devices adjacent thereto in a symmetrical structure.

11. The tiling display device of claim 8, wherein at least some of the plurality of contact units of each of the plurality of display devices are disposed to be offset from the plurality of contact units of the display devices adjacent thereto in an asymmetrical structure.

12. The tiling display device of claim 8, wherein the plurality of display devices include a first display device and a second display device that are disposed adjacent to each other, a plurality of contact units disposed on the side surfaces of the display panel of the first display device contact with a plurality of contact units disposed on the side surfaces of the display panel of the second display device, respectively, wherein when the switching unit of the first display device and the switching unit of the second display device are turned on, the metal cover of the first display device and the metal cover of the second display device are electrically connected to each other through the plurality of contact units corresponding to the first display device and the second display device.

13. The tiling display device of claim 12, wherein when the switching unit of the first display device and the switching unit of the second display device are turned off, the plurality of contact units corresponding to the first display device and the second display device are floating, and the metal cover of the first display device and the metal cover of the second display device are electrically separated from each other.

14. The tiling display device of claim 8, wherein in one display device among the plurality of display devices, the plurality of contact units are connected to one switching unit.

15. The tiling display device of claim 8, wherein in one display device among the plurality of display devices, the switching unit includes a plurality of switching units, and the plurality of contact units are connected to the plurality of switching units, respectively.

16. The tiling display device of claim 15, wherein the plurality of switching units includes:

a first switching unit connected to a contact unit disposed on an upper side surface of the display panel among the plurality of contact units;

a second switching unit connected to a contact unit disposed on a lower side surface of the display panel among the plurality of contact units;

a third switching unit connected to a contact unit disposed on a left side surface of the display panel among the plurality of contact units; and a fourth switching unit connected to a contact unit disposed on a right side surface of the display panel among the plurality of contact units.

17. The tiling display device of claim 16, wherein only the metal covers of vertically adjacent display devices among the plurality of display devices are electrically connected to each other when only the first switching unit and the second switching unit of each of the plurality of display devices are turned on.

18. The tiling display device of claim 17, wherein only the metal covers of left and right adjacent display devices among the plurality of display devices are electrically connected to each other when only the third switching unit and the fourth switching unit of each of the plurality of display devices are turned on.

* * * * *